(12) United States Patent
Iida

(10) Patent No.: US 7,144,275 B2
(45) Date of Patent: Dec. 5, 2006

(54) WATER-RESISTANT CASING STRUCTURE FOR ELECTRONIC CONTROL DEVICE

(75) Inventor: Taku Iida, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/212,564

(22) Filed: Aug. 29, 2005

(65) Prior Publication Data

US 2006/0046535 A1   Mar. 2, 2006

(30) Foreign Application Priority Data

Aug. 30, 2004 (JP) ............................. 2004-250910
Jun. 24, 2005 (JP) ............................. 2005-185515

(51) Int. Cl.
*H01R 13/40* (2006.01)
(52) U.S. Cl. ..................................... 439/587
(58) Field of Classification Search ................ 439/587, 439/588, 589, 936
See application file for complete search history.

(56) References Cited

U.S. PATENT DOCUMENTS

| | | | | |
|---|---|---|---|---|
| 3,755,615 A | * | 8/1973 | Paullus et al. | 174/76 |
| 4,193,655 A | * | 3/1980 | Herrmann, Jr. | 439/166 |
| 4,241,967 A | * | 12/1980 | Collins | 439/589 |
| 4,702,539 A | * | 10/1987 | Cusick et al. | 439/588 |
| 4,998,894 A | * | 3/1991 | Gronvall | 439/521 |
| 5,387,129 A | * | 2/1995 | Hotea | 439/587 |
| 5,535,512 A | * | 7/1996 | Armogan | 29/877 |
| 6,407,925 B1 | | 6/2002 | Kobayashi et al. | |
| 6,707,678 B1 | | 3/2004 | Kobayashi et al. | |

FOREIGN PATENT DOCUMENTS

| | | |
|---|---|---|
| JP | 4-88681 | 7/1992 |
| JP | 10-22658 | 1/1998 |
| JP | 2000-316219 | 11/2000 |
| JP | 2001-85858 | 3/2001 |

* cited by examiner

*Primary Examiner*—Tulsidas C. Patel
*Assistant Examiner*—Phuongchi Nguyen
(74) *Attorney, Agent, or Firm*—Nixon & Vanderhye P.C.

(57) ABSTRACT

A circuit board supporting electronic components mounted thereon is housed in a casing. The casing has a joint hole defined therein, and a connector is inserted in the joint hole with a water-resistant seal placed in a gap between the connector and edges of the casing which define the joint hole. The casing is of a trapezoidal shape and has a pair of parallel sides spaced from each other by a distance, the parallel sides having respective lengths greater than the distance between the parallel sides. The casing has a tooth as a stop which has a tip end held against the connector at a position in which the casing and the connector closely confront each other in or near a region of at least one of the parallel sides which is sealed by the water-resistant seal.

11 Claims, 14 Drawing Sheets

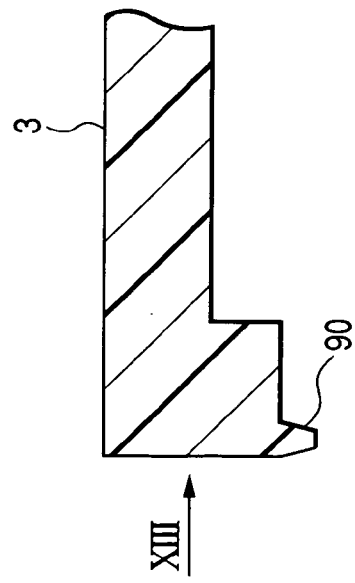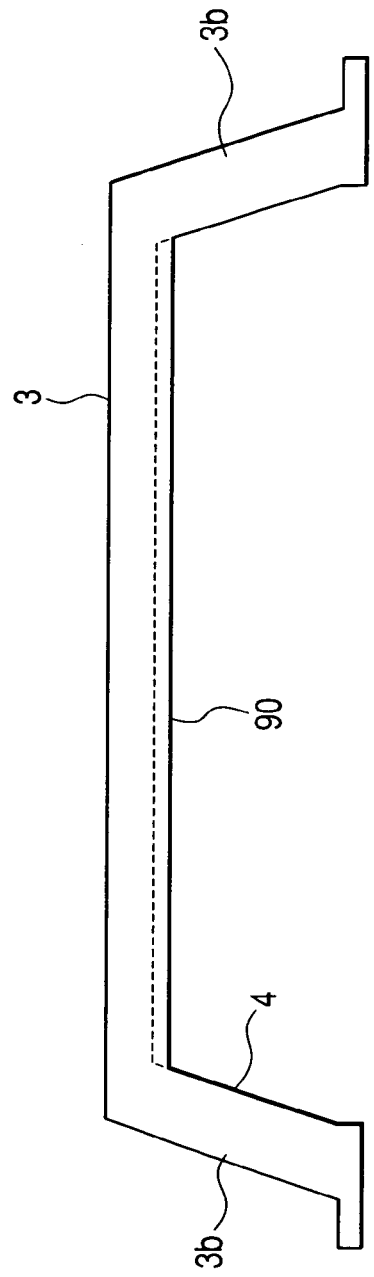

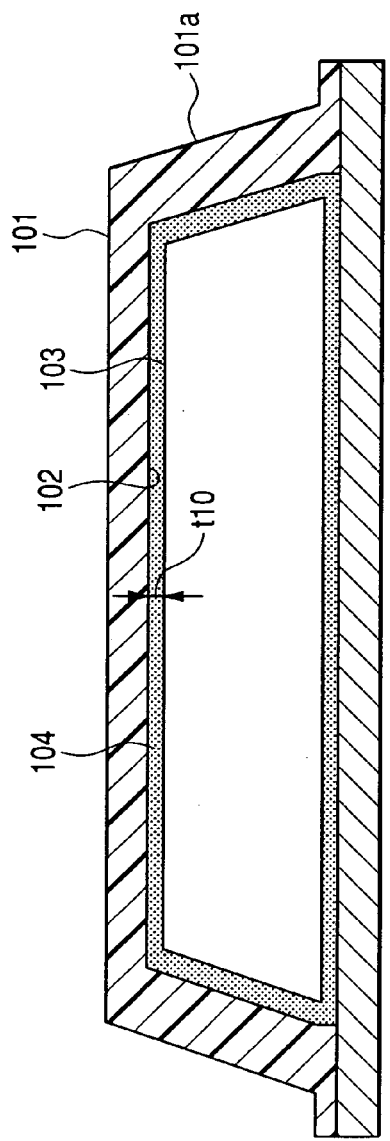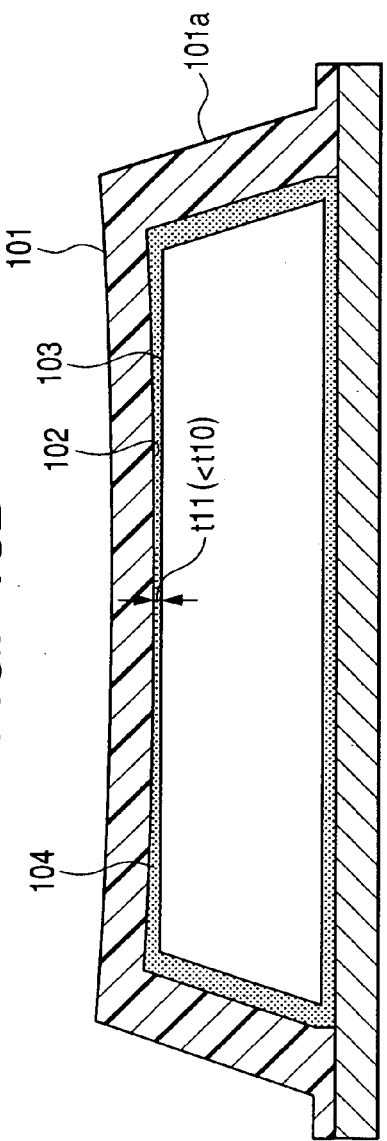

WATER-RESISTANT CASING STRUCTURE
FOR ELECTRONIC CONTROL DEVICE

CROSS-REFERENCE TO RELATED
APPLICATIONS

This application is based upon and claims the benefits of priority from the prior Japanese Patent Application No. 2004-250910, filed on Aug. 30, 2004, and the prior Japanese Patent Application No. 2005-185515, filed on Jun. 24, 2005, the entire contents of which are incorporated herein by reference.

BACKGROUND OF THE INVENTION

1. Field of the Invention

The present invention relates to a water-resistant casing structure for use with an electronic control device.

2. Description of the Related Art

One known water-resistant casing structure for use with an electronic control device for vehicle-mounted engine control, for example, employs a rubber gasket as disclosed in Japanese laid-open patent publication No. H10-22658.

The disclosed water-resistant casing structure will be described below with reference to FIGS. 17, 18A, and 18B of the accompanying drawings. FIG. 17 is a fragmentary cross-sectional view of a water-resistant casing structure of a casing 101 and a connector 103 attached thereto. FIGS. 18A and 18B are cross-sectional views taken along line XVIII—XVIII of FIG. 17. As shown in FIGS. 17 and 18A, the connector 103 is inserted in a joint hole 102 defined in the casing 101 with a water-resistant seal 104 placed in a gap between the connector 103 and edges of the casing 101 which define the joint hole 102, hermetically sealing the casing 101.

When the temperature of the casing 101 changes, a pressure difference is developed between the external and internal spaces of the casing 101, i.e., the difference between an external pressure Po around the casing 101 and an internal pressure Pi within the casing 101. If the casing 101 is made of a material of low strength, then the ceiling or upper edge of the casing 101 above the joint hole 102 flexes due to the pressure difference. Specifically, when the internal pressure Pi becomes lower than the external pressure Po, i.e., when a negative pressure is developed in the casing 101, the ceiling of the casing 101 above the joint hole 102 flexes so as to be convex downwardly as shown in FIG. 188. As a result, the thickness of the water-resistant seal 104 decreases from t10 to t11 (<t10). The water-resistant seal 104 undergoes greater stresses and may possibly lose its water-resistant capability. If the sealing function of the water-resistant seal 104 fails, then the electronic control device enclosed in the casing 101 may be damaged by water introduced into the casing 101.

SUMMARY OF THE INVENTION

It is an object of the present invention to provide a water-resistant casing structure for use with an electronic control device, which is capable of minimizing stresses developed in a water-resistant seal and hence keeping the water-resistant seal effective long enough to allow the electronic control device to operate reliably for a long period of time.

According to the present invention, there is provided an electronic control device comprising a circuit board supporting electronic components mounted thereon, a casing housing the circuit board therein, the casing having a joint hole defined therein and having a quadrangular shape, the joint hole having a pair of parallel sides spaced from each other by a distance, the parallel sides having respective lengths greater than the distance between the parallel sides, and a connector inserted in the joint hole with a water-resistant seal placed in a gap between the connector and edges of the casing which define the joint hole, one of the casing and the connector having a tooth as a stop, the tooth having a tip end held against the other of the casing and the connector, at a position in which the casing and the connector closely confront each other in or near a region of at least one of the parallel sides which is sealed by the water-resistant seal.

When the casing at the sealed region tends to be deformed toward the connector due to the pressure difference between the spaces inside and outside of the casing, the tooth whose tip end is held against the casing or the connector prevents the casing from being deformed toward the connector. As a result, stresses imposed on the water-resistant seal are minimized, making the water-resistant seal highly reliable for a long period of time.

The tooth may be provided on the casing or the connector. If the tooth is provided on the casing near the sealed region, then the water-resistant seal may be of the liquid-phase adhesive type or the resiliently compressible type. Similarly, if the tooth is provided on the connector near the sealed region, then the water-resistant seal may be of the liquid-phase adhesive type or the resiliently compressible type.

In the above electronic control device, the casing may have the tooth disposed on a wall thereof and having the tip end held against the connector, the wall being resiliently curved toward the connector before the casing is assembled, and after the casing is assembled with the tip end held against the connector, the wall may be normally biased toward the connector under a resilient force imposed by the wall which has been resiliently curved toward the connector before the casing is assembled. When the pressure in the casing becomes higher than the pressure around the casing, the casing is less liable to be deformed outwardly, preventing the water-resistant seal from being peeled off.

In the above electronic control device, the casing may have the tooth disposed on a wall thereof and extending continuously along the region of the at least one of the parallel sides which is sealed by the water-resistant seal. The tooth thus constructed serves as a rib for stiffening the casing to minimize stresses imposed on the water-resistant seal.

In the above electronic control device, the casing may include a member providing at least one of the parallel sides, the member being made of synthetic resin with glass fibers mixed therewith. The tooth as a stop is highly effective because the member of the casing tends to suffer warpage due to the orientation of the glass fibers.

In the above electronic control device, the casing may include a member providing at least one of the parallel sides, the member comprising a metal plate.

The electronic control device may be arranged for controlling an engine mounted in an engine compartment of a vehicle, the electronic control device being disposed in the engine compartment.

According to the present invention, there is also provided a water-resistant casing structure comprising a casing for housing therein a circuit board supporting electronic components mounted thereon, the casing having a joint hole defined therein and having a quadrangular shape, the joint hole having a pair of parallel sides spaced from each other by a distance, the parallel sides having respective lengths greater than the distance between the parallel sides, and a connector inserted in the joint hole with a water-resistant seal placed in a gap between the connector and edges of the casing which define the joint hole, one of the casing and the connector having a tooth as a stop, the tooth having a tip end held against the other of the casing and the connector, at a position in which the casing and the connector closely confront each other in or near a region of at least one of the parallel sides which is sealed by the water-resistant seal.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 13A is an enlarged fragmentary cross-sectional view of an upper case of a casing of a water-resistant casing structure according to a fifth embodiment of the present invention;

FIG. 13B is an elevational view of the upper case as viewed in the direction indicated by the arrow XIII in FIG. 13A;

FIGS. 18A and 18B are vertical cross-sectional views taken along line XVIII—XVIII of FIG. 17.

DESCRIPTION OF THE PREFERRED EMBODIMENTS

Figure 1:
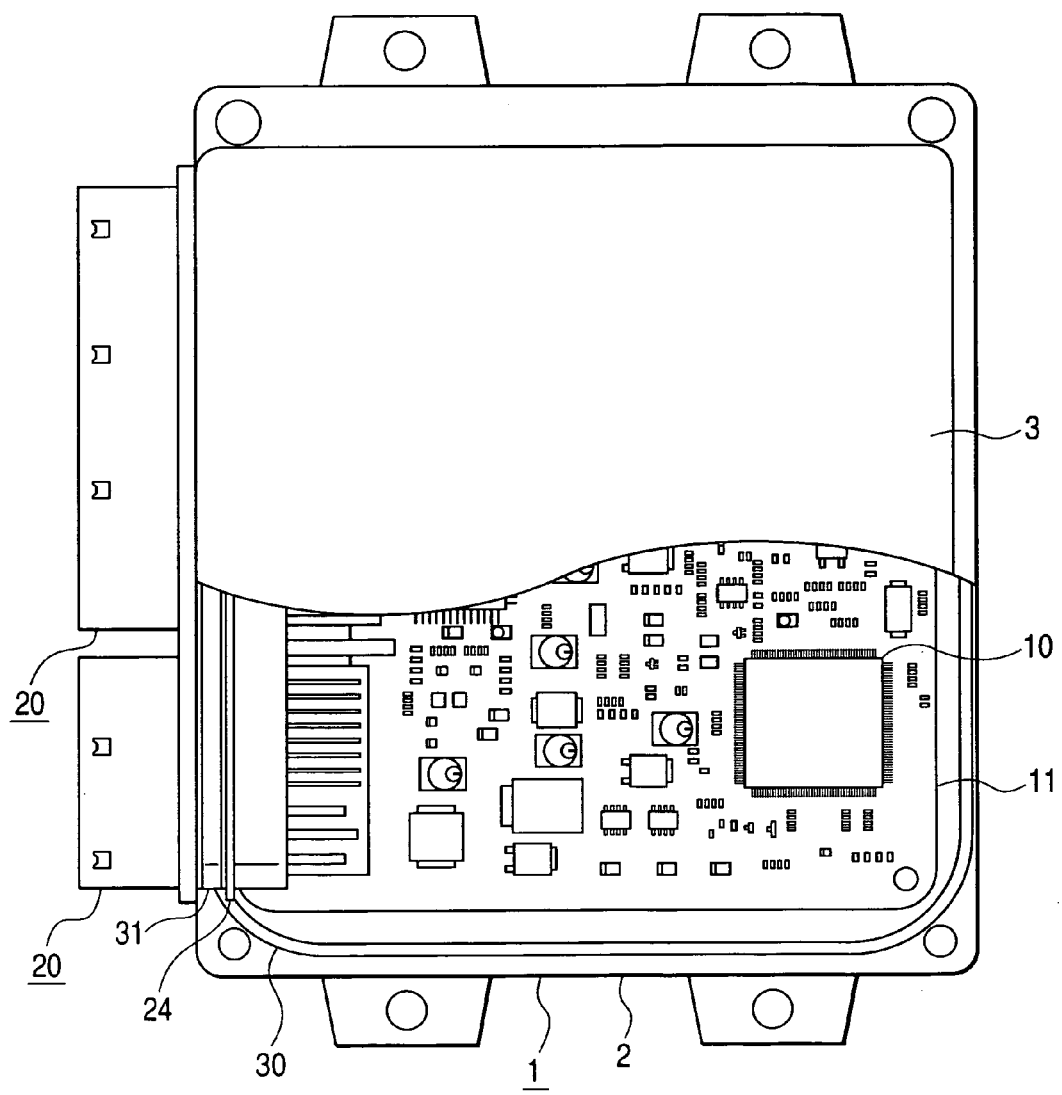
FIG. 1 is a plan view, partly in cut away, of a water-resistant casing structure according to a first embodiment of the present invention, the water-resistant casing structure including a casing enclosing therein an electronic control device.

Like or corresponding parts are denoted by like or corresponding reference characters throughout views.

An electronic control device housed in a water-resistant casing structure according to the present invention is an electronic control device for controlling a vehicle-mounted engine, for example. The electronic control device is placed in the engine compartment of a motor vehicle, and therefore is subject to high ambient temperatures and exposed to water.

1st Embodiment

Figure 2:
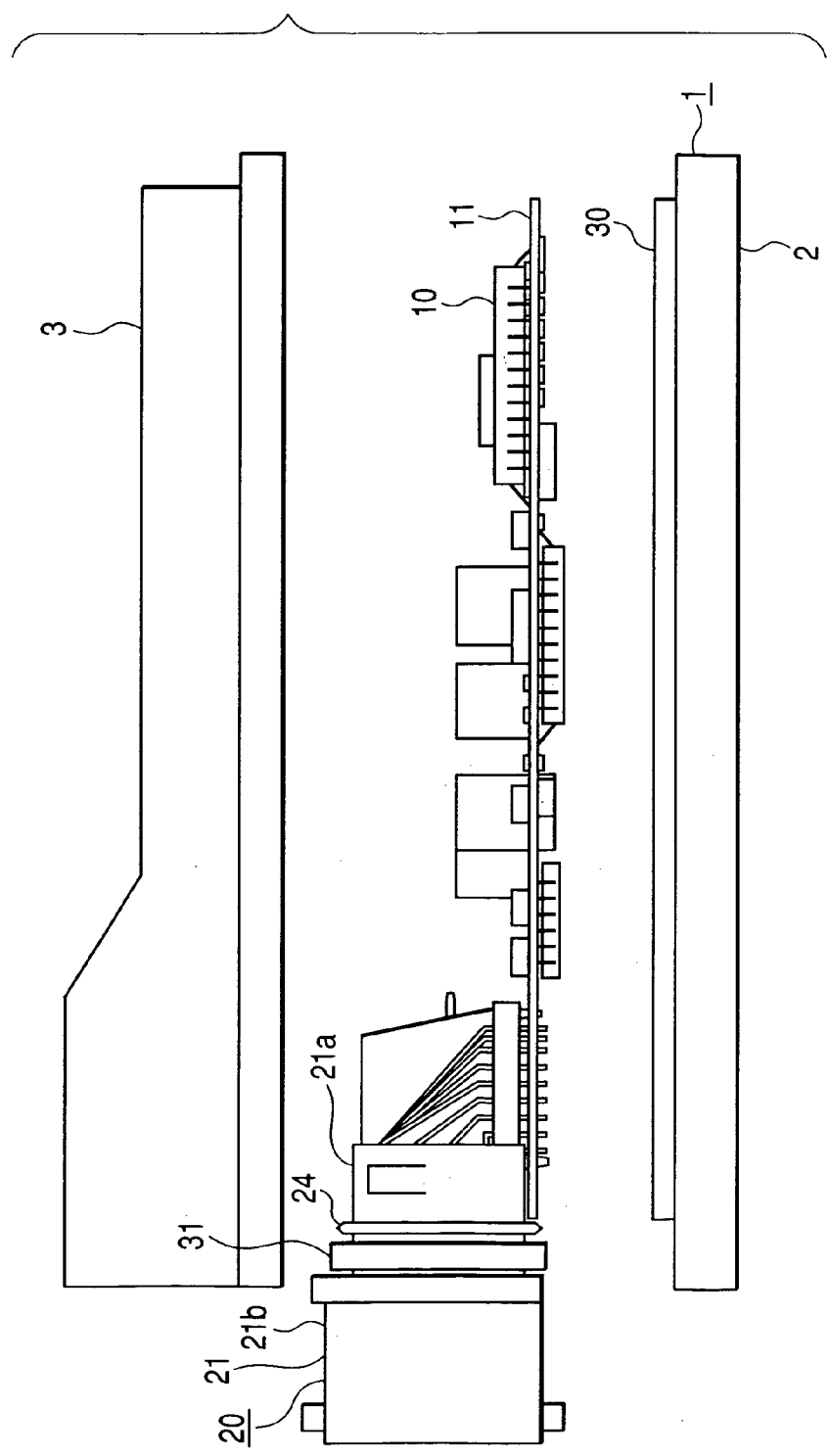
FIG. 2 is an exploded side elevational view of the casing and the electronic control device.

As shown in FIGS. 1 and 2, a water-resistant casing structure according to a first embodiment of the present invention has a casing 1 housing the electronic control device therein. The casing 1 comprises a lower case 2 serving as a base plate and an upper case 3 serving as a cover. The lower case 2 is in the form of an aluminum die-casting, and the upper case 3 is molded of synthetic resin. The lower case 2 comprises a flat square plate. The upper case 3 comprises a downwardly open square box having a lower opening, and is mounted on the lower case 2 which closes the lower opening of the upper case 3. The lower case 2 and the upper case 3 are fastened to each other by screws, for example, with an annular water-resistant seal 30 interposed therebetween. The annular water-resistant seal 30 hermetically seals the space defined between the lower case 2 and the upper case 3. The box-shaped casing 1 is substantially square in shape as viewed in plan, and has a height much smaller than horizontal dimensions thereof.

Figure 3:
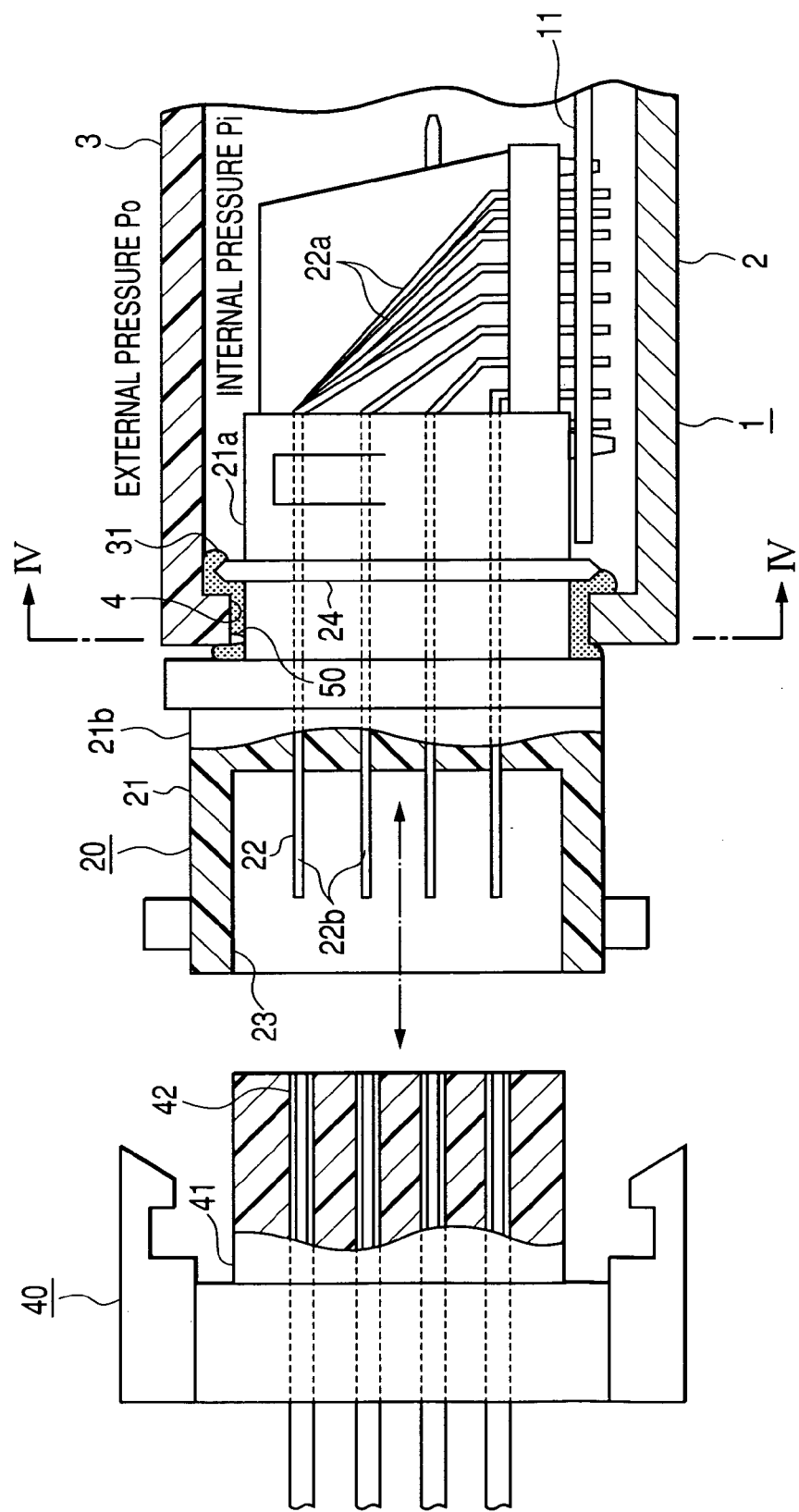
FIG. 3 is a fragmentary horizontal cross-sectional view of the water-resistant casing structure which includes a connector attached to the casing.
Figure 4:
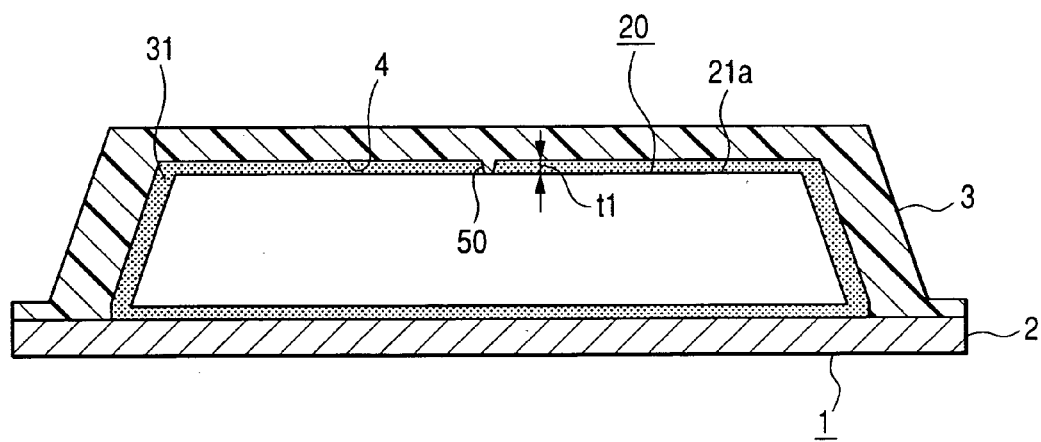
FIG. 4 is a vertical cross-sectional view taken along line IV—IV of FIG. 3.

The electronic control device housed in the casing 1 includes a circuit board 11 supporting electronic components 10 mounted thereon. As shown in FIGS. 3 and 4, the casing 1 has a joint hole 4 defined in a left side wall thereof and having a size slightly smaller than the size of the left side wall. As shown in FIG. 4, the joint hole 4 has a lower side provided by the lower case 2 and opposite lateral sides and an upper (ceiling) side provided by the upper case 3.

Figure 16A:
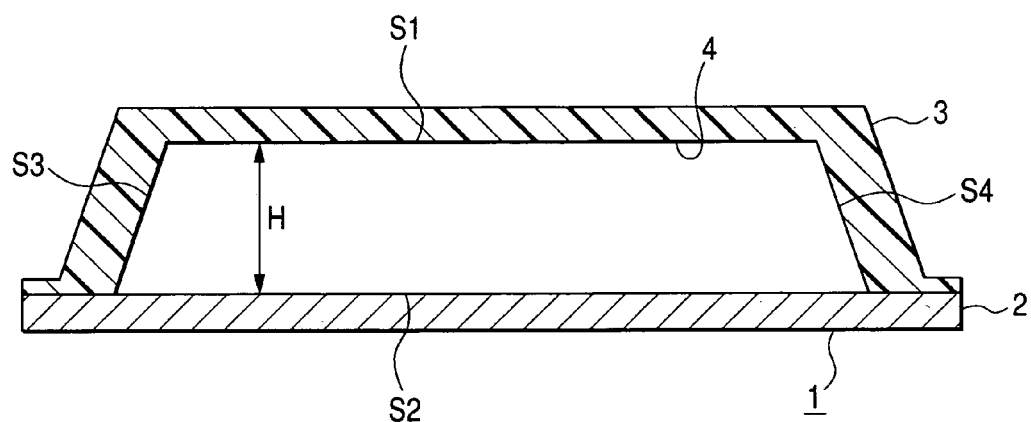
FIG. 16A is a vertical cross-sectional view showing the cross-sectional shape of a joint hole.

As shown in FIG. 16A, the joint hole 4 has a quadrangular shape, specifically, a trapezoidal shape, having upper and lower sides S1, S2 extending parallel to each other and slanted lateral sides S3, S4 extending between the upper and lower sides S1, S2. The upper and lower sides S1, S2 are longer than the slanted lateral sides S3, S4. The lower side S2 is longer than the upper side S1. The upper and lower sides S1, S2 have respective lengths greater than the height of the joint hole 4, i.e., the distance H between the parallel upper and lower sides S1, S2. Since the lower case 2 is an aluminum die-casting, it is hardly deformable. However, the upper case 3 which is molded of synthetic resin is liable to be deformable. Particular, the upper side S1 which is longer than the lateral sides S3, S4 is more deformable than the lateral sides S3, S4.

In FIGS. 3 and 4, a connector 20 is inserted in the joint hole 4 with a water-resistant seal 31 placed in, i.e., filling, a gap between the connector 20 and the sides of the joint hole 4, hermetically sealing the casing 1. As shown in FIG. 3, the connector 20 has connector pins 22 for electrically connecting the electronic components 10 on the circuit board. 11 in the casing 1 to an external electronic device.

The connector 20 includes a connector block 21 molded of synthetic resin, and the connector pins 22 are embedded in the connector block 21. The connector block 21 comprises an inner block member 21a of reduced thickness which extends through the joint hole 4 into the casing 1 and an outer block member 21b of increased thickness positioned outside of the casing 1. The connector pins 22 have inner end portions 22a extending from the inner block member 21a downwardly through the circuit board 11 to the lower surface of the circuit board 11 where they are welded to wiring patterns on the circuit board 11. The connector pins 22 also have outer end portions 22b extending from the outer block member 21b into a cavity 23 defined in the outer block member 21b. When a connector block 41 of a companion connector 40 is inserted into the cavity 23 in the outer block member 21b, the outer end portions 22b of the connector pins 22 are inserted respectively into sockets 42 defined in the connector block 41 of the companion connector 40, thereby electrically interconnecting the connectors 20, 40.

The connector 20 is electrically connected through the companion connector 40 to electric wires that are connected to a battery, various sensors, and engine control actuators. The electronic control device housed in the casing 1 detects an operating state of the engine based on sensor signals, performs various processing operations, and actuates various engine control actuators such as injectors, igniters, etc. to operate the engine under optimum conditions.

A ring-shaped ridge 24 is mounted on the outer peripheral surface of the inner block member 21a of the connector block 21 inwardly of the joint hole 4 within the casing 1. The water-resistant seal 31 is of the liquid-phase adhesive type and is disposed between the sides of the joint hole 4 and the inner block member 21a of the connector block 21. The water-resistant seal 31 is prevented from flowing out of the joint hole 4 by the cuter block member 21b of the connector 21, and is also prevented from flowing into the casing 1 by the ring-shaped ridge 24 on the inner block member 21a. The ring-shaped ridge 24 which engages the water-resistant seal 31 increases the sealing area of the water-resistant seal 31. The water-resistant seal 31 of the liquid-phase adhesive type may be made of silicone, butyl, or the like.

Figure 5:
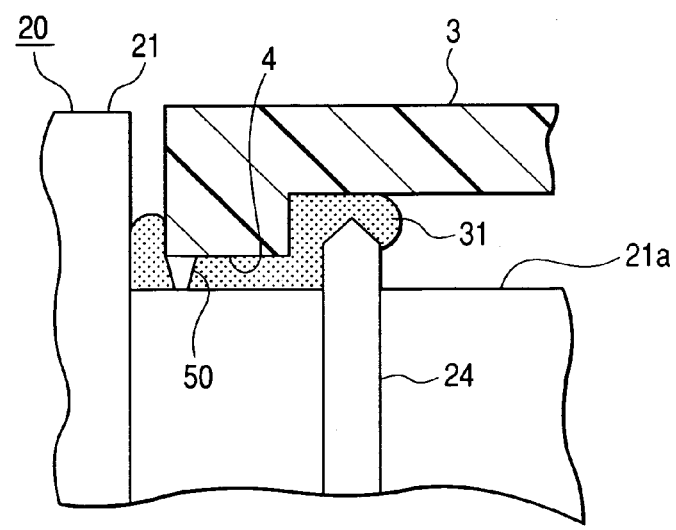
FIG. 5 is an enlarged fragmentary cross-sectional view of a seal disposed around the connector shown in FIG. 3.

As shown in FIGS. 3, 4, and 5, a downwardly projecting tooth 50 as a stop is disposed on the upper side of the joint hole 4 at a central position in the horizontal direction in FIG. 4. Specifically, the tooth 50 is integrally formed with the upper case 3 at the central position in the horizontal direction in FIG. 4. The tooth 50 is of a conical or pyramidal shape whose horizontal cross-sectional shape is progressively smaller downwardly toward its lower tip end. The lower tip end of the tooth 50 is held against an upper surface of the inner block member 21a which is sealed by the water-resistant seal 31.

For assembling the water-resistant casing structure, the peripheral surface of the inner block member 21a is coated with the water-resistant seal 31 of the liquid-phase adhesive type. Then, the lower and upper cases 2, 3 are put together with the coated inner block member 21a interposed between the upper, lateral, and lower sides of the joint hole 4.

Because the connector 20 is relatively large compared with the casing 1, and the sealed length of the casing 1 is large, the casing 1 tends to suffer warpage. When the temperature within the casing 1 abruptly drops due for example to water applied to the casing 1, an internal pressure Pi within the casing 1 becomes lower than an external pressure Po outside of the casing 1, i.e., the atmospheric pressure. At this time, the tooth 50 of upper case 3 is held against the upper surface of the inner block member 21a, preventing the upper side of the joint hole 4, i.e., the upper edge of the upper casing 3, from flexing downwardly and hence from compressing the water-resistant seal 31. As a consequence, the water-resistant seal 31 is prevented from suffering undue stresses and is allowed to keep its water-resistant capability.

The water-resistant casing structure according to the first embodiment offers the following advantages: The joint hole 4 has the quadrangular shape which has the upper and lower sides S1, S2 extending parallel to each other and having the respective lengths greater than the distance H between the parallel upper and lower sides S1, S2. The tooth 50 as a stop is integrally formed with the casing 1 and has its lower tip end held against the connector 20 in the region sealed by the water-resistant seat 31 where the edge of the casing 1 which serves as the upper side S1 of the joint hole 4 is disclosed closely to and faces the connector 20. When the casing 1 in the sealed region is deformed toward the connector 20 because of the pressure difference between the spaces inside and outside of the casing 1, the tooth 50 whose tip end held against the connector 20 prevents the casing 1 from flexing toward the connector 20. As a result, undue stresses imposed on the water-resistant seal 31 between the casing 1 and the connector 20 are minimized, allowing the water-resistant seal 31 to keep its water-resistant capability highly reliably for a long period of time.

Figure 17:
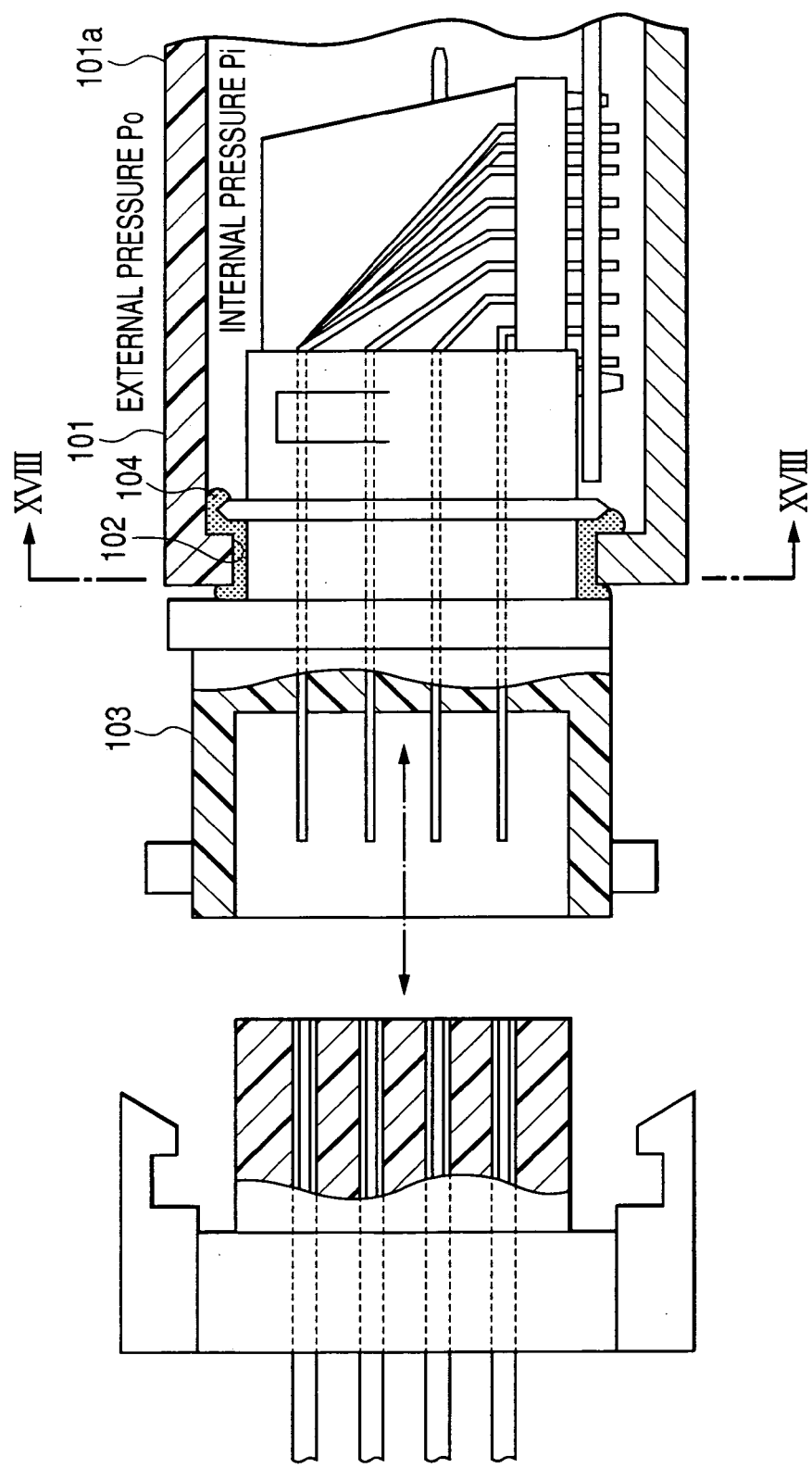
FIG. 17 is a fragmentary horizontal cross-sectional view of a conventional water-resistant casing structure.

More specifically, it has heretofore been customary to employ rubber gaskets in water-resistant casing structures for housing electronic control devices for vehicle-mounted engine control. According to the general practice, aluminum die-casting casings have been used for vehicle-mounted electronic control devices. However, there has emerged a need for casings of synthetic resin to meet growing demands for lightweight and inexpensive casings. For example, as shown in FIGS. 17 and 18A, an upper case 101a of the conventional casing 101 is made of synthetic resin, and the connector 103 is inserted in the joint hole 102 with the water-resistant seal 104 placed in the gap between the connector 103 and the casing 101. When the difference between the external pressure Po and the internal pressure Pi increases, the ceiling or upper edge of the upper case 101a of synthetic resin above the joint hole 102 flexes due to the pressure difference, as shown in FIG. 18B. The water-resistant seal 104 undergoes increased stresses and may possibly lose its water-resistant capability.

According to the present embodiment, the tooth 50 as a stop on the uppercase 3 is effective to minimize undue stresses imposed on the water-resistant seal 31, allowing the water-resistant seal 31 to keep its water-resistant capability highly reliably for a long period of time.

According to the present embodiment, furthermore, since the water-resistant seal 31 can have its thickness t1 controllable in the presence of the tooth 50, undue stresses imposed on the water-resistant seal 31 can be minimized not only when the casing 1 flexes due to a negative pressure developed therein upon a change in the ambient temperature, but also when the companion connector 40 is inserted into and removed from the cavity 23 in the connector 21 of the connector 20.

In the region sealed by the water-resistant seat 31 where the edge of the casing 1 which serves as the upper side S1 of the joint hole 4 is disposed closely to and faces the connector 20, a tooth as a stop may be provided on the connector 20, rather than the casing 1, and may have its tip end held against the casing 1, i.e., the upper case 3 thereof.

Figure 16B:
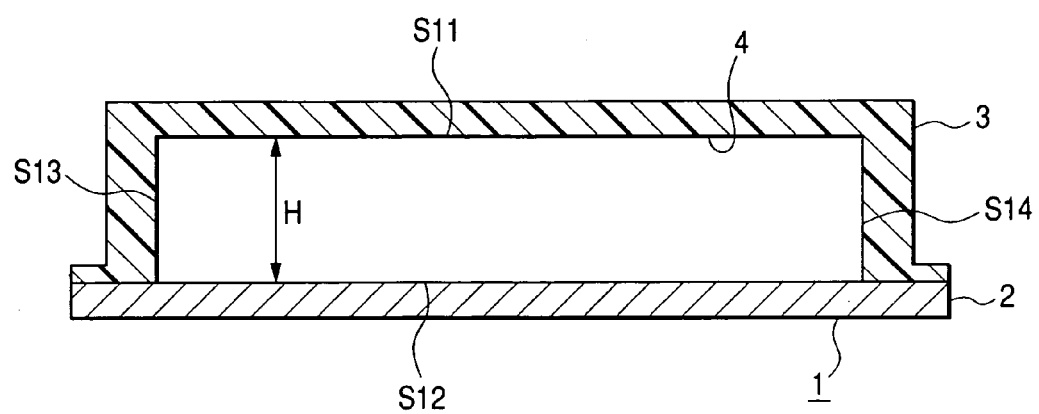
FIG. 16B is a vertical cross-sectional view showing the cross-sectional shape of another joint hole.

As shown in FIG. 16B, the joint hole 4 may have a rectangular shape, rather than a trapezoidal shape, having upper and lower sides S11, S12 and lateral sides S13, S14 extending between the upper and lower sides S11, S12 and shorter than the upper and lower sides S11, S12. Specifically, the upper and lower sides S11, S12 have respective lengths greater than the height of the joint hole 4, i.e., the distance H between the parallel upper and lower sides S11, S12, i.e., the length of the lateral sides S13, S14. In the region sealed by the water-resistant seat 31 where the edge of the casing 1 which serves as the upper side S11 of the joint hole 4 is disposed closely to and faces the connector 20, the tooth 50 as a stop is disposed on the casing 1, i.e., the upper case 3, and has its tip end held against the connector 20.

The lower case 2 of the casing 1 may be made of synthetic resin. If both the upper and lower cases 3, 2 of the casing 1 are made of synthetic resin, then teeth 50 as stops may be disposed respectively on the upper and lower sides S1, S2 shown in FIG. 16A, or may be disposed respectively on the upper and lower sides S11, S22 shown in FIG. 16B.

2nd Embodiment

A water-resistant casing structure according to a second embodiment of the present invention will be described below with reference to FIGS. 6, 7, and 8. Only parts of the water-resistant casing structure according to the second embodiment which are different from the water-resistant casing structure according to the first embodiment will be described in detail below.

Figure 6:
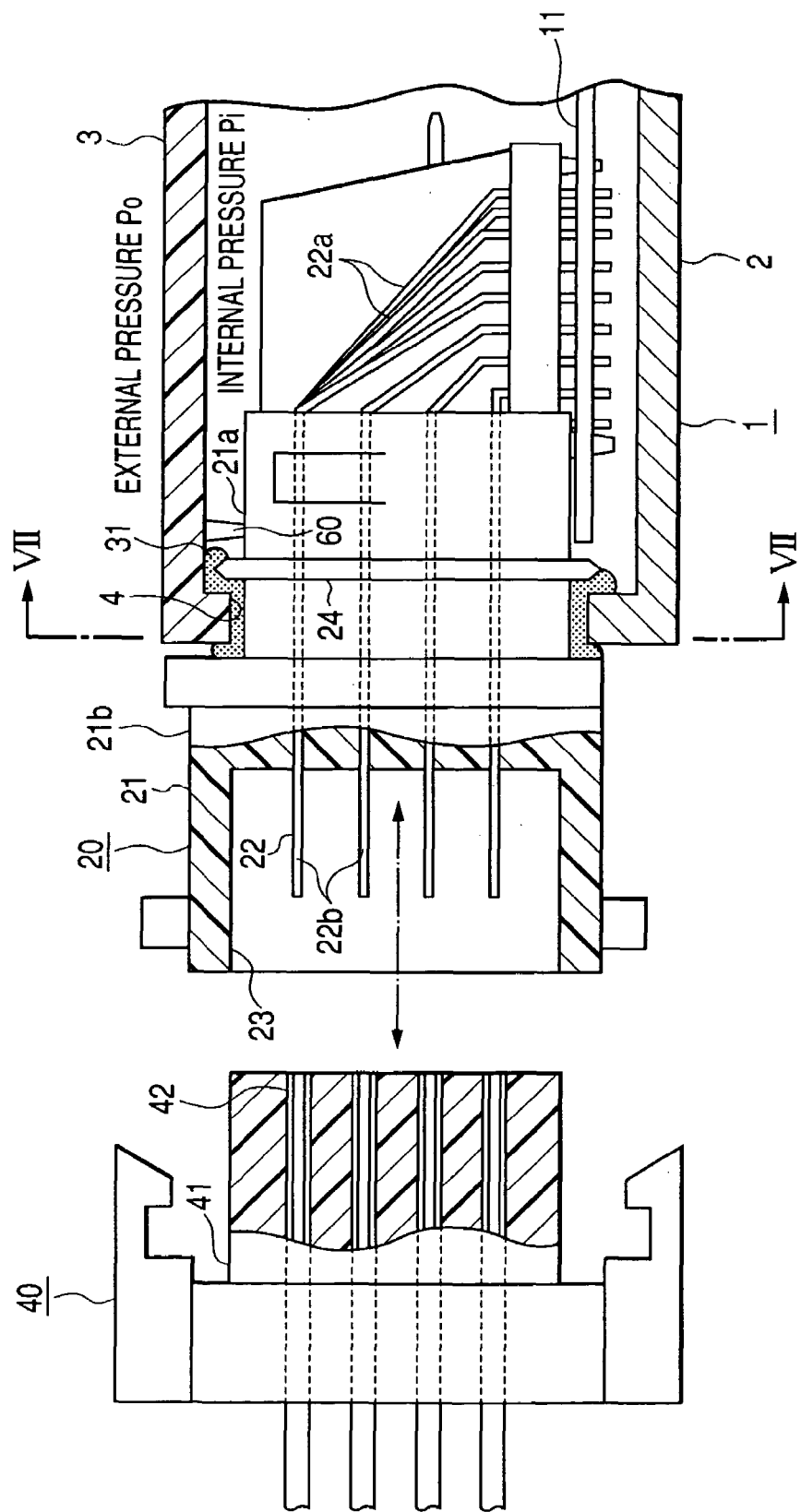
FIG. 6 is a fragmentary horizontal cross-sectional view of a water-resistant casing structure according to a second embodiment of the present invention, the water-resistant casing structure including a casing and a connector attached thereto.
Figure 7:
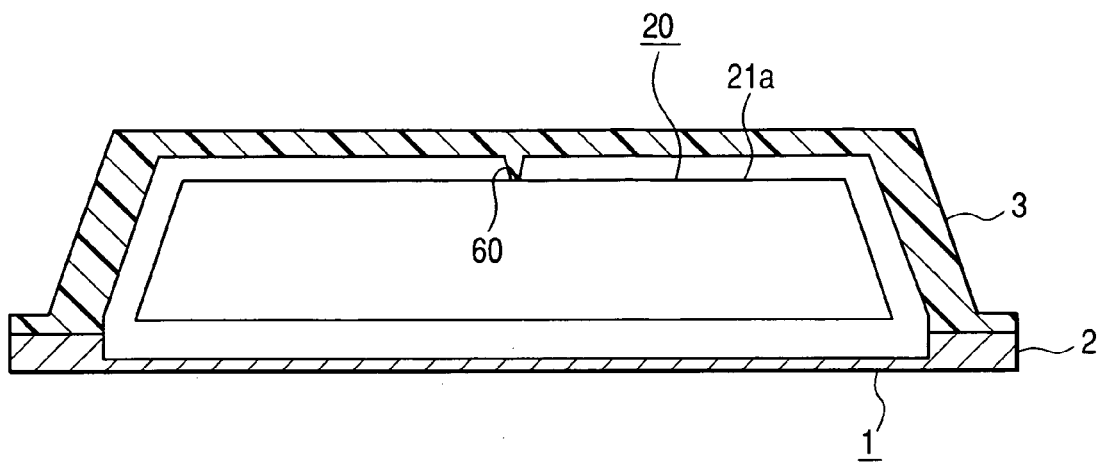
FIG. 7 is a vertical cross-sectional view taken along line VII—VII of FIG. 6.
Figure 8:
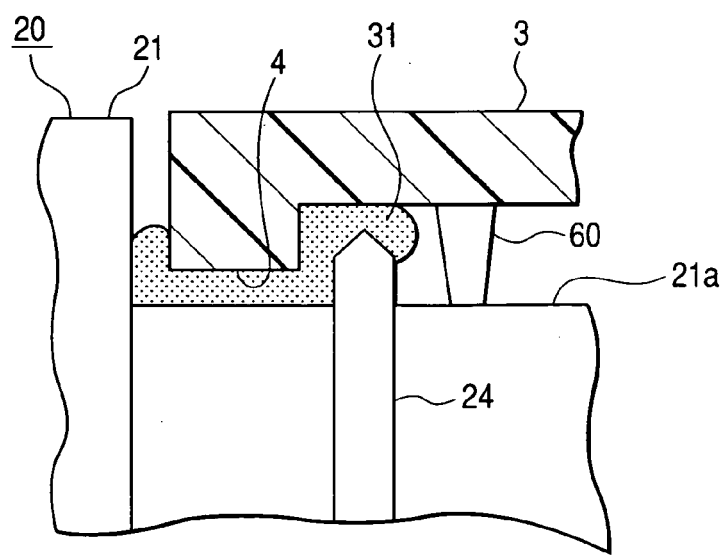
FIG. 8 is an enlarged fragmentary cross-sectional view of a seal disposed around the connector shown in FIG. 6.

According to the second embodiment, as shown in FIGS. 6, 7, and 8, a tooth 60 as a stop is disposed on the casing 1, i.e., the upper case 3 thereof, at a position closely confronting the connector 20 near the region sealed by the water-resistant seat 31.

Specifically, the inner block member 21a of the connector 21 extends through the joint hole 4 into the casing 1, and has an upper surface closely confronting the upper case 3 of the casing 1. The tooth 60 is disposed at a central position in the horizontal direction in FIG. 7. The tooth 60 is integrally formed with the upper case 3 in a region which is positioned slightly inwardly of the water-resistant seal 31, i.e., in a region which is not contacted by the water-resistant seal 31. The tooth 60 has a lower tip end held against an upper surface of the inner block member 21a which is not sealed by the water-resistant seal 31, i.e., which is positioned slightly inwardly of the ring-shaped ridge 24 in the casing 1. The tooth 60 is of a conical or pyramidal shape whose horizontal cross-sectional shape is progressively smaller downwardly toward its lower tip end.

According to the second embodiment, as the tool 60 is not positioned within the water-resistant seal 31, the water-resistant seal 31 may be of the liquid-phase adhesive type as described above, or may be of the resiliently compressible type such as an O-ring 3rd Embodiment A water-resistant casing structure according to a third embodiment of the present invention will be described below with reference to FIGS. 9, 10, and 11. Only parts of the water-resistant casing structure according to the third embodiment which are different from the water-resistant casing structure according to the second embodiment will be described in detail below.

Figure 9:
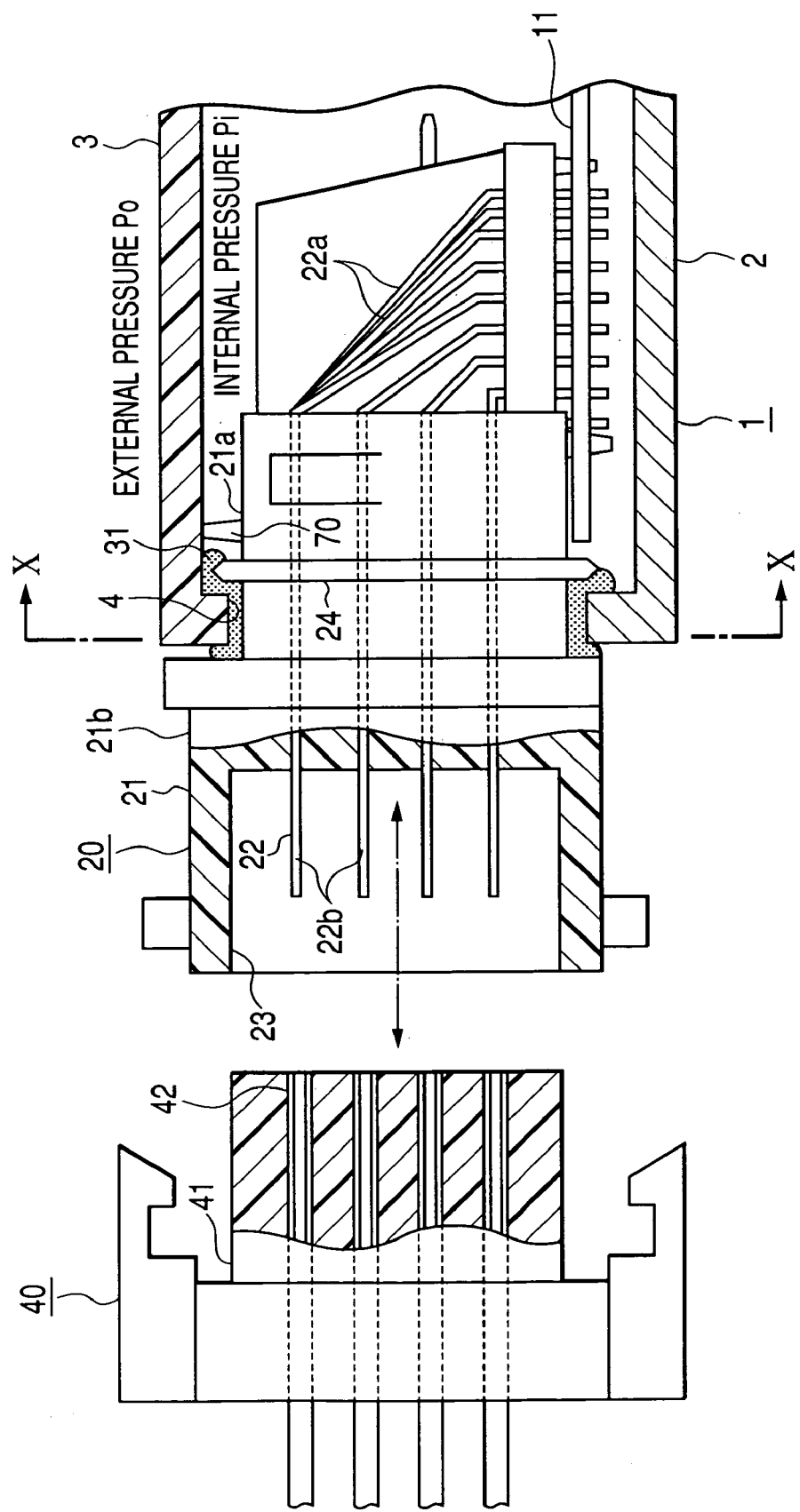
FIG. 9 is a fragmentary horizontal cross-sectional view of a water-resistant casing structure according to a third embodiment of the present invention, the water-resistant casing structure including a casing and a connector attached thereto.
Figure 10:
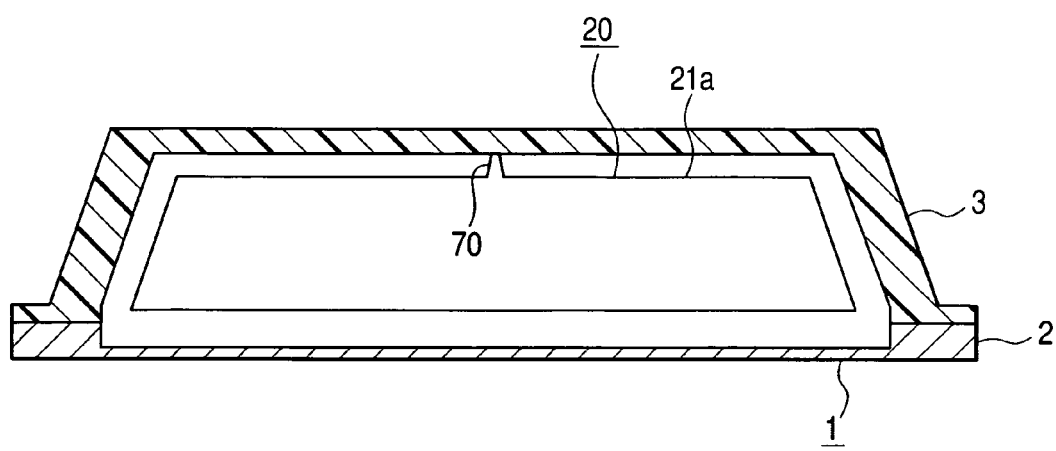
FIG. 10 is a vertical cross-sectional view taken along line X—X of FIG. 9.
Figure 11:
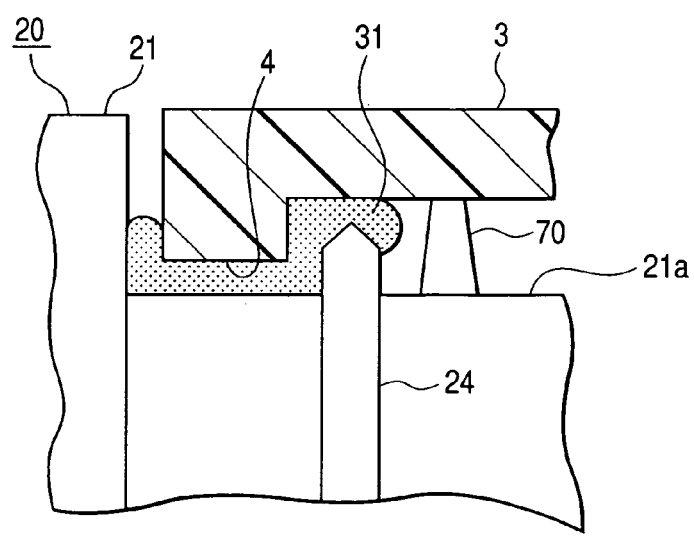
FIG. 11 is an enlarged fragmentary cross-sectional view of a seal disposed around the connector shown in FIG. 9.

According to the third embodiment, as shown in FIGS. 9, 10, and 11, a tooth 70 as a stop is disposed on the connector 20, i.e., the inner block member 21a thereof, at a position closely confronting the casing 1 near the region sealed by the water-resistant seat 31.

Specifically, the tooth 70 is integrally formed with an upper surface of the inner block member 21a in a region which is positioned slightly inwardly of the water-resistant seal 31, i.e., in a region which is not contacted by the water-resistant seal 31. The tooth 70 is disposed at a central position in the horizontal direction in FIG. 10. The tooth 70 has an upper tip end held against a lower surface of the upper case 3 which is not sealed by the water-resistant seal 31, i.e., which is positioned slightly inwardly of the ring-shaped ridge 24 in the casing 1. The tooth 70 is of a conical or pyramidal shape whose horizontal cross-sectional shape is progressively smaller upwardly toward its upper tip end.

When the internal pressure Pi within the casing 1 becomes lower than an external pressure Po outside of the casing 1, the casing 1, i.e., the upper case 3 thereof, tends to be deformed toward the connector 20. However, since the tooth 70 has its upper tip end held against the casing 1, the casing 1 is prevented from being deformed toward the connector 20. As a consequence, the water-resistant seal 31 is prevented from suffering undue stresses and is allowed to keep its water-resistant capability. According to the third embodiment, the water-resistant seal 31 may be of the liquid-phase adhesive type as described above, or may be of the resiliently compressible type such as an O-ring.

The water-resistant casing structure according to the second embodiment or the water-resistant casing structure according to the third embodiment may be selected based on the ease with which to form the tooth as a stop on the casing 1 or the connector 20.

4th Embodiment

A water-resistant casing structure according to a fourth embodiment of the present invention will be described below with reference to FIGS. 12A and 12B. Only parts of the water-resistant casing structure according to the fourth embodiment which are different from the water-resistant casing structure according to the second embodiment will be described in detail below.

Figure 12A:
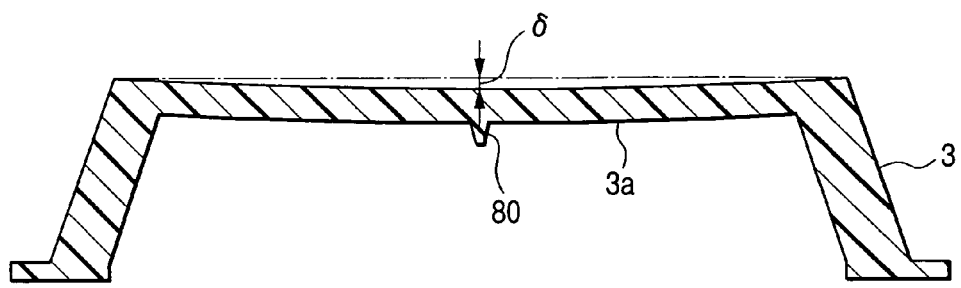
FIG. 12A is a vertical cross-sectional view of an upper case, to be assembled, of a casing of a water-resistant casing structure according to a fourth embodiment of the present invention.
Figure 12B:
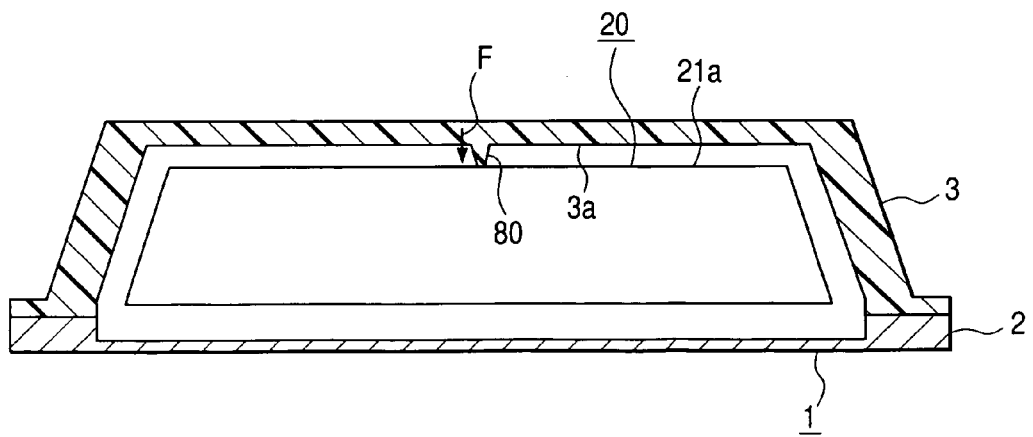
FIG. 12B is a vertical cross-sectional view of the assembled casing of the water-resistant casing structure according to the fourth embodiment of the present invention.

FIG. 12A shows in vertical cross section an upper case 3, to be assembled, of a casing 1 of a water-resistant casing structure according to a fourth embodiment of the present invention, and FIG. 12B shows the assembled casing 1 in vertical cross section.

According to the second embodiment, as shown in FIG. 12A, a tooth 80 as a stop is disposed on an upper wall 3a of the upper case 3 of the casing 1 at a position closely confronting the connector 20 near the region sealed by the water-resistant seat 31. The tooth 80 is disposed at a central position in the horizontal direction in FIG. 12A. Before the casing 1 is assembled, the upper wall 3a of the upper case 3 on which the tooth 80 is disposed is resiliently curved downwardly by a distance δ so as to be convex downwardly toward the connector 20. The upper case 3 thus constructed, the lower case 2, and the connector 20 are then assembled into the casing 1, as shown in FIG. 12B. Since the tooth 80 has a lower tip end held against the connector 20, the upper wall 3a of the upper case 3 is forcibly displaced upwardly against its own flexing resiliency, eliminating the distance δ.

After the casing 1 is thus assembled, the upper wall 3a of the upper case 3 is normally biased downwardly toward the connector 20 under the resilient force (spring force) F of the upper wall 33a which flexes downwardly before the upper case 3 is assembled.

When a negative pressure is developed in the casing 1, i.e., when the internal pressure in the casing 1 becomes lower than the external pressure around the casing 1, the tooth 80 minimizes compressive stresses posed on the water-resistant seal 31. In addition, when a positive pressure is developed in the casing 1, i.e., when the internal pressure in the casing 1 becomes higher than the external pressure around the casing 1 due to a change in the atmospheric pressure, for example, the resilient force (spring force) F of the upper wall 33a which tends to flex downwardly before the upper case 3 is assembled is effective to prevent the casing 1 from being deformed outwardly and hence from peeling off the water-resistant seal 31, i.e., to prevent the water-resistant seal 31 from reducing its own compressive sealing ability.

5th Embodiment

A water-resistant casing structure according to a fifth embodiment of the present invention will be described below with reference to FIGS. 13A and 13B. Only parts of the water-resistant casing structure according to the fifth embodiment which are different from the water-resistant casing structure according to the first embodiment will be described in detail below.

According to the fifth embodiment, as shown in FIGS. 13A and 13B, a tooth 90 as a stop is disposed on the upper case 3 of the casing 1 at the outer end of the joint hole 4 and extends continuously horizontally along the upper side of the joint hole 4. The tooth 90 has its opposite lateral ends joined to the lateral sides of the joint hole 4, i.e., lateral side walls 3b of the upper case 3. Since the tooth 90 extends continuously horizontally along the upper side of the joint hole 4, it functions as a rib for stiffening the upper side of the joint hole 4 and hence the upper case 3. The stiffened upper case 3 is less liable to be deformed, thus minimizing stresses imposed on the water-resistant seal 31 in the joint hole 4.

The tooth 90 which extends as a stiffening rib continuously horizontally along the upper side of the joint hole 4 may be incorporated in the water-resistant casing structure according to the second embodiment shown in FIGS. 6, 7, and 8.

The upper case 3 shown in FIG. 16A may be made of synthetic resin with glass fibers mixed therewith for increased mechanical strength. However, if the upper case 3 is made of synthetic resin with glass fibers mixed therewith, then the upper case 3 tends to suffer greater warpage due to the orientation of the glass fibers than if the upper case 3 is made of synthetic resin with balls mixed therewith. If the principles of the present invention according to either one of the first through fifth embodiments described above are applied to a casing whose upper case is made of synthetic resin with glass fibers mixed therewith, then the upper case is prevented from being unduly deformed and stresses imposed on the water-resistant seal are minimized to make the water-resistant seal highly reliable for a long period of time. The principles of the present invention according to either one of the first through fifth embodiments described above are also applicable to a casing whose upper and/or lower case is made of synthetic resin with glass fibers mixed therewith.

6th Embodiment

A water-resistant casing structure according to a sixth embodiment of the present invention will be described below with reference to FIG. 14. Only parts of the water-resistant casing structure according to the fifth embodiment which are different from the water-resistant casing structure according to the first embodiment will be described in detail below.

Figure 14:
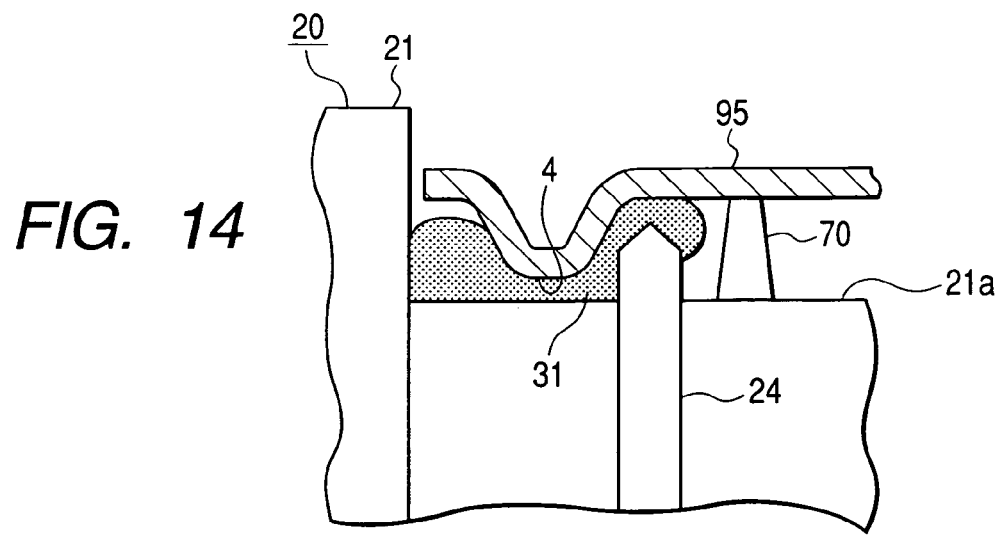
FIG. 14 is an enlarged fragmentary cross-sectional view of a water-resistant casing structure according to a sixth embodiment of the present invention.

As shown in FIG. 14, the water-resistant casing structure according to the sixth embodiment has a casing including an upper case 95 in the form of a thin metal plate such as a thin plate of iron or aluminum that is pressed to shape.

The upper case 95 in the form of a thin metal plate is more liable to flex due to the pressure difference between the spaces inside and outside of the casing than if the upper case is in the form of a die-casting.

According to the sixth embodiment, as with the third embodiment shown in FIG. 11, a tooth 70 as a stop is disposed on an upper surface of the inner block member 21a in a region which is positioned slightly inwardly of the water-resistant seal 31, i.e., in a region which is not contacted by the water-resistant seal 31. The tooth 70 is disposed at a central position in the horizontal direction. The tooth 70 has an upper tip end held against a lower surface of the upper case 95 which is not sealed by the water-resistant seal 31, i.e., which is positioned slightly inwardly of the ring-shaped ridge 24 in the casing 1.

Figure 15A:
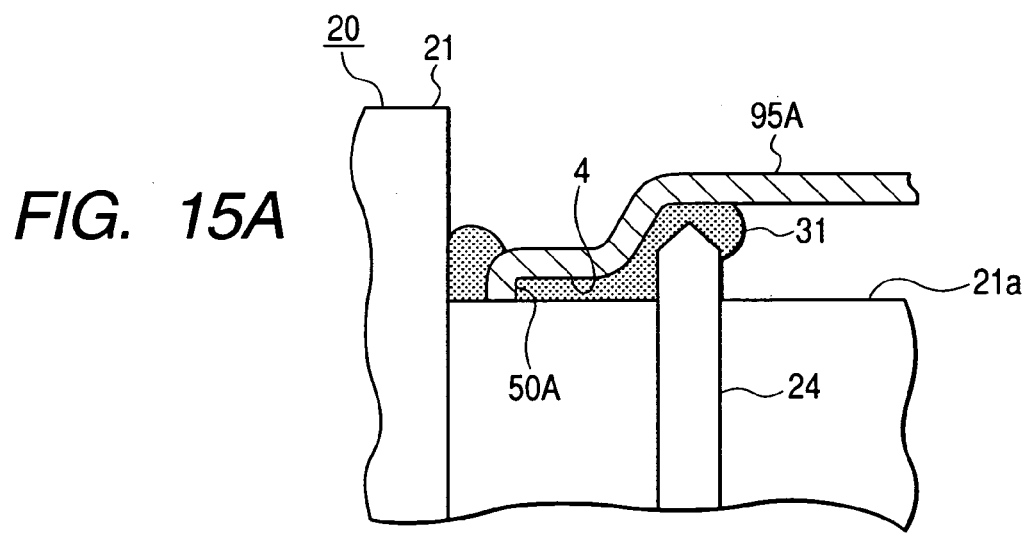
FIG. 15A is an enlarged fragmentary cross-sectional view of a modified water-resistant casing structure according to the present invention.

FIG. 15A shows in enlarged fragmentary cross section a modified water-resistant casing structure according to the present invention. The modified water-resistant casing structure shown in FIG. 15A has a casing including an upper case 95A in the form of a thin metal plate such as a thin plate of iron or aluminum that is pressed to shape. The upper case 95A has a tooth 50A disposed as a stop on its distal end and projecting downwardly from the upper side of the joint hole 4. The tooth 50A has a lower tip end held against the upper surface 21a of the inner block member 21 of the connector 20 in the water-resistant seal 31.

Figure 15B:
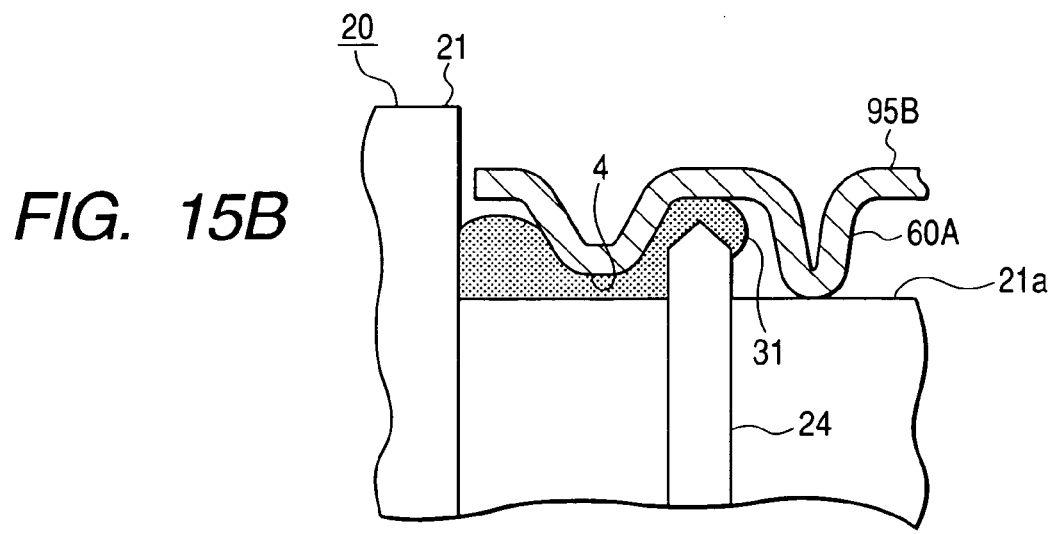
FIG. 15B is an enlarged fragmentary cross-sectional view of another modified water-resistant casing structure according to the present invention.

FIG. 15B shows in enlarged fragmentary cross section another modified water-resistant casing structure according to the present invention. The modified water-resistant casing structure shown in FIG. 15B has a casing including an upper case 95B in the form of a thin metal plate such as a thin plate of iron or aluminum that is pressed to shape. The upper case 95B has a tooth 60B disposed as a stop at a position closely confronting the connector 20 near the region sealed by the water-resistant seat 31, i.e., in a region which is positioned slightly inwardly of the water-resistant seal 31, i.e., in a region which is not contacted by the water-resistant seal 31.

The principles of the modifications shown in FIGS. 15A and 15B are also applicable to a water-resistant casing structure having a casing whose upper and/or lower case is in the form of a pressed thin metal plate.

Although certain preferred embodiments of the present invention have been shown and described in detail, it should be understood that various changes and modifications may be made therein without departing from the scope of the appended claims.

What is claimed is:

1. An electronic control device comprising:
   a circuit board supporting electronic components mounted thereon;
   a casing housing said circuit board therein;
   said casing having a joint hole defined therein and having a quadrangular shape, said joint hole having a pair of parallel sides spaced from each other by a distance, said parallel sides having respective lengths greater than said distance between the parallel sides; and a connector inserted in said joint hole with a water-resistant seal placed in a gap between said connector and edges of said casing which define said joint hole;

one of said casing and said connector having a tooth as a stop, said tooth having a tip end held against the other of said casing and said connector, at a position in which said casing and said connector closely confront each other in or near a region of at least one of said parallel sides which is sealed by said water-resistant seal.

2. An electronic control device according to claim 1, wherein said casing has said tooth disposed on a wall thereof and having said tip end held against said connector, said wall being resiliently curved toward said connector before said casing is assembled, and wherein after said casing is assembled with said tip end held against said connector, said wall is normally biased toward said connector under a resilient force imposed by the wall which has been resiliently curved toward said connector before said casing is assembled.

3. An electronic control device according to claim 1, wherein said casing has said tooth disposed on a wall thereof and extending continuously along said region of said at least one of said parallel sides which is sealed by said water-resistant seal.

4. An electronic control device according to claim 1, wherein said casing includes a member providing at least one of said parallel sides, said member being made of synthetic resin with glass fibers mixed therewith.

5. An electronic control device according to claim 1, wherein said casing includes a member providing at least one of said parallel sides, said member comprising a metal plate.

6. An electronic control device according to claim 1, for controlling an engine mounted in an engine compartment of a vehicle, said electronic control device being disposed in said engine compartment.

7. A water-resistant casing structure comprising:

a casing for housing therein a circuit board supporting electronic components mounted the thereon;

said casing having a joint hole defined therein and having a quadrangular shape, said joint hole having a pair of parallel sides spaced from each other by a distance, said parallel sides having respective lengths greater than said distance between the parallel sides; and a connector inserted in said joint hole with a water-resistant seal placed in a gap between said connector and edges of said casing which define said joint hole;

one of said casing and said connector having a tooth as a stop, said tooth having a tip end held against the other of said casing and said connector, at a position in which said casing and said connector closely confront each other in or near a region of at least one of said parallel sides which is sealed by said water-resistant seal.

8. A water-resistant casing structure according to claim 7, wherein said casing has said tooth disposed on a wall thereof and having said tip end held against said connector, said wall being resiliently curved toward said connector before said casing is assembled, and wherein after said casing is assembled with said tip end held against said connector, said wall is normally biased toward said connector under a resilient force imposed by the wall which has been resiliently curved toward said connector before said casing is assembled.

9. A water-resistant casing structure according to claim 7, wherein said casing has said tooth disposed on a wall thereof and extending continuously along said region of said at least one of said parallel sides which is sealed by said water-resistant seal.

10. A water-resistant casing structure according to claim 7, wherein said casing includes a member providing at least one of said parallel sides, said member being made of synthetic resin with glass fibers mixed therewith.

11. A water-resistant casing structure according to claim 7, wherein said casing includes a member providing at least one of said parallel sides, said member comprising a metal plate.

* * * * *